(12) United States Patent
Hayden, Sr. et al.

(10) Patent No.: US 10,194,557 B2
(45) Date of Patent: Jan. 29, 2019

(54) THERMAL MANAGEMENT SYSTEM

(71) Applicant: Cisco Technology, Inc., San Jose, CA (US)

(72) Inventors: Perry L. Hayden, Sr., Salinas, CA (US); Gary Chan, San Jose, CA (US); Bob Dillman, San Jose, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 560 days.

(21) Appl. No.: 14/620,581

(22) Filed: Feb. 12, 2015

(65) Prior Publication Data

US 2016/0242317 A1 Aug. 18, 2016

(51) Int. Cl.
*H05K 7/20* (2006.01)
(52) U.S. Cl.
CPC ............................. *H05K 7/20127* (2013.01)
(58) Field of Classification Search
CPC .................................................. H05K 7/20127
See application file for complete search history.

(56) References Cited

U.S. PATENT DOCUMENTS

| | | | | |
|---|---|---|---|---|
| 5,361,188 A * | 11/1994 | Kondou | ................ | H01L 23/467 165/104.34 |
| 8,861,196 B2 * | 10/2014 | Kayama | ............. | H05K 7/20145 174/548 |
| 9,047,066 B2 * | 6/2015 | Mongia | .................... | G06F 1/203 |
| 9,170,615 B2 * | 10/2015 | Wilke | ................. | H05K 7/20727 |
| 2004/0050569 A1 * | 3/2004 | Leyda | ................. | H05K 7/20563 174/50 |
| 2004/0184233 A1 * | 9/2004 | Yamada | ............. | H05K 7/20572 361/690 |
| 2010/0302727 A1 * | 12/2010 | Bellin | ................ | H05K 7/20581 361/679.49 |
| 2012/0227930 A1 * | 9/2012 | Rowe | .................. | H05K 7/20145 165/11.1 |

\* cited by examiner

*Primary Examiner* — Len Tran
*Assistant Examiner* — Gordon Jones
(74) *Attorney, Agent, or Firm* — Ronald Fernando; Fernando & Partners, LLP

(57) ABSTRACT

Various implementations disclosed herein include a thermal management system suitable electronic devices. In some implementations, a thermal management system includes an air guide and a cage wall, which together provide: an air intake having a first airflow area to produce a first air pressure; an airflow constriction, following the air intake, having a second airflow area smaller than the first airflow area to produce a second air pressure, and defining a first region; and an outlet following the airflow constriction having a third airflow area greater than the second airflow area to produce a third air pressure. The device cage has at least one aperture in the first region. The second air pressure is less than the first air pressure and the third air pressure and is sufficiently low to draw heated air from within the device cage through the at least one aperture to be expelled through the outlet.

13 Claims, 10 Drawing Sheets

THERMAL MANAGEMENT SYSTEM

TECHNICAL FIELD

The present disclosure generally relates to cooling electronic devices, and particularly to an air guide based thermal management system suitable for electronic devices.

BACKGROUND

Some electronic devices and systems employ thermal management systems and techniques, which is provided in order to limit temperature increases of various components during operation. Some electronic devices, such as switches and routers, include small form-factor pluggable (SFP) transceiver modules that are difficult to adequately cool using known thermal management systems and techniques. In particular, the combination of relatively high power (e.g., ~1.5 Watts) and a low temperature limit (e.g., ~70° C.) can make SFP transceiver modules difficult to thermally manage. Failing to prevent SFP transceiver modules from overheating can result in malfunctions, such as data errors, link loss, and can also render a port unusable.

Some SFP transceiver modules are arranged within cages in order to reduce electromagnetic interference (EMI). The cages often exacerbate the thermal management problem. For example, a typical cage configuration traps heat inside the cage. Cages typically include thin gauge steel walls that have apertures for ventilation. However, these features yield limited results. Airflow tends to merely pass over the surface of a cage wall and does little to cool the interior of the cage, and steel is unfortunately not a good conductor of heat. Additionally, apertures are kept small in order to comply with EMI standards, and as a result, the apertures alone do not enable adequate ventilation. Furthermore, some cages have features that can block air from exiting the cage. As a result, heat is often trapped inside.

One known method of addressing the thermal management problems associated with SFP cages includes using a heat sink attached to the cage through a thermal interface material (TIM). However, there are a number of problems associated with using a heat sink. For example, a heat sink adds undesired volume to the device package, weight and cost.

BRIEF DESCRIPTION OF THE DRAWINGS

So that the present disclosure can be understood by those of ordinary skill in the art, a more detailed description may be had by reference to aspects of some illustrative implementations, some of which are shown in the accompanying drawings. The appended drawings, however, illustrate only some example features of the present disclosure and are therefore not to be considered limiting, for the description may admit to other effective features.

Figure 1:
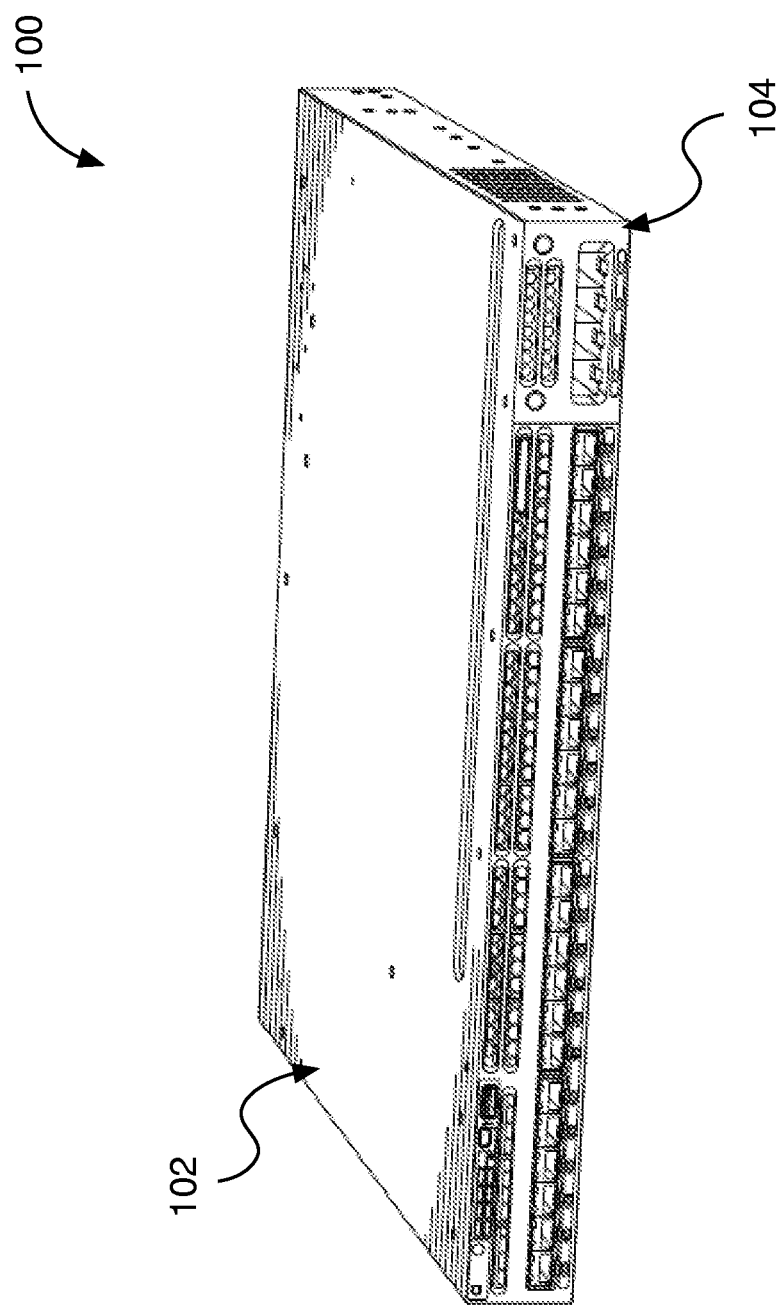
FIG. 1 is a perspective view of a switch according to some implementations.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DESCRIPTION

Numerous details are described herein in order to provide a thorough understanding of illustrative implementations shown in the drawings. However, the drawings merely show some example aspects of the present disclosure and are therefore not to be considered limiting. Those of ordinary skill in the art will appreciate from the present disclosure that other effective aspects and/or variants do not include all of the specific details described herein. Moreover, well-known systems, methods, components, devices and circuits have not been described in exhaustive detail so as not to unnecessarily obscure more pertinent aspects of the implementations described herein.

Overview

Previously available thermal management systems provided for SFP cage implementations do not adequately cool the interior of the cage. By contrast, various implementations disclosed herein include a thermal management system suitable for devices, and particularly, electronic devices including device cages having perforated walls. In some implementations, a thermal management system includes an air guide configured to, in conjunction with a cage wall, produce an air pressure low enough to draw heated air out of the device cage. In particular, in some implementations, a thermal management system includes an air guide and a cage wall, which together provide: an air intake having a first airflow area to produce a first air pressure; an airflow constriction, following the air intake, having a second airflow area smaller than the first airflow area to produce a second air pressure, and defining a first region; and an outlet following the airflow constriction having a third airflow area greater than the second airflow area to produce a third air pressure. The device cage has at least one aperture in the first region. The second air pressure is less than the first air pressure and the third air pressure and is sufficiently low to draw heated air from within the device cage through the at least one aperture to be expelled through the outlet.

In some implementations, the disclosed air guide is coupled to the device cage and has at least a portion that is spaced apart from the device cage. Together, the air guide and the device cage form a converging-diverging body for passing air, similar to that of a converging-diverging Venturi nozzle. As air from outside the air guide and device cage flows into an intake portion at the front of the device cage, and between a surface of the air guide, such as an inner surface of the air guide, and a cage surface, such as an upper surface of the device cage, the airflow area (e.g., the cross-sectional area through which air can flow) is reduced (converging portion) and the air is accelerated until its velocity reaches a maximum at the narrowest section (constriction portion). Based on Bernoulli's principle, and with changes in air density between the different portions of the air guide and in the device cage being negligible (i.e., the density of the air is typically relatively constant throughout the thermal management system), the higher velocity air at the narrowest section has a lower air pressure than the air at the intake portion. The higher-velocity, lower pressure air draws air, including heated air, from within the device cage, out through at least one aperture in the device cage. The air drawn from within the device cage is expelled through an outlet portion (a diverging portion) following the constriction portion. Since the airflow area of the outlet portion is greater than the narrowest section, the air velocity is reduced and the air pressure increases.

At the intake portion the air pressure is greater than the air pressure within a zone of the device cage. As a result, at least a portion of the higher pressure air from the intake portion is drawn into the device cage through the apertures and comes into contact with the device or devices contained within the device cage, such as a SFP transceiver module. According to some implementations, the air guide includes smooth, curved surfaces to reduce air turbulence at the air guide surface by minimizing friction drag and pressure losses.

Figure 2:
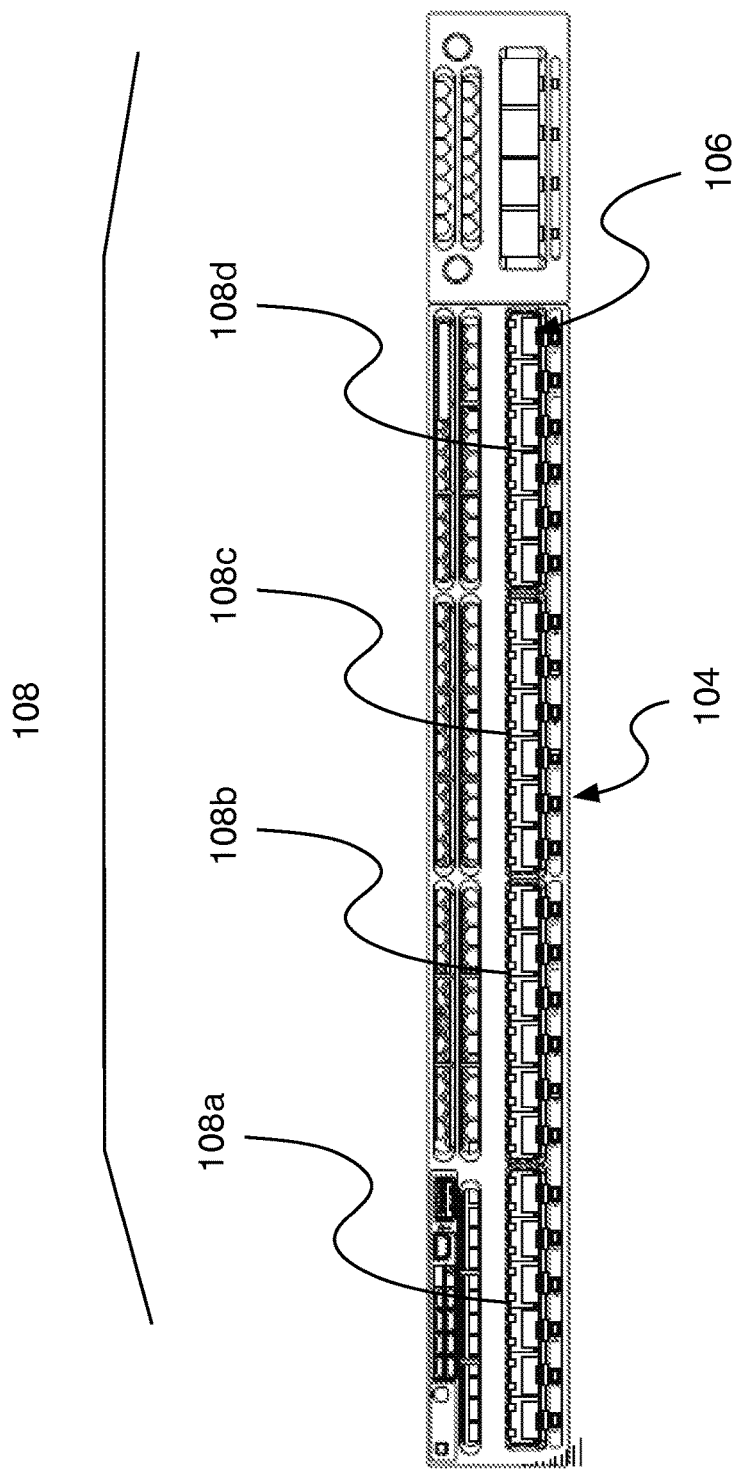
FIG. 2 is an elevation view of the port side of the switch of FIG. 1.

FIGS. 1 and 2 depict an example aggregator switch system 100 including an external case 102 and a portside panel 104. Switch system 100 includes devices 106 (also referred to individually as device 106 in FIG. 2) contained within device cages 108 (also referred to individually as device cage 108). Devices 106 are, for example, be SFP transceiver modules. In some implementations, device cages 108 are comprise port cages. However, any devices that generate heat within the cages 108 and any device cages suitable for the devices 106 are contemplated.

FIGS. 3 to 6 depict an example implementation of a thermal management system 110 for devices 106 that includes device cages 108 and an air guide 112. While pertinent features are illustrated, those skilled in the art will appreciate from the present disclosure that various other features have not been illustrated for the sake of brevity and so as not to obscure more pertinent aspects of the disclosed example implementations.

Figure 3:
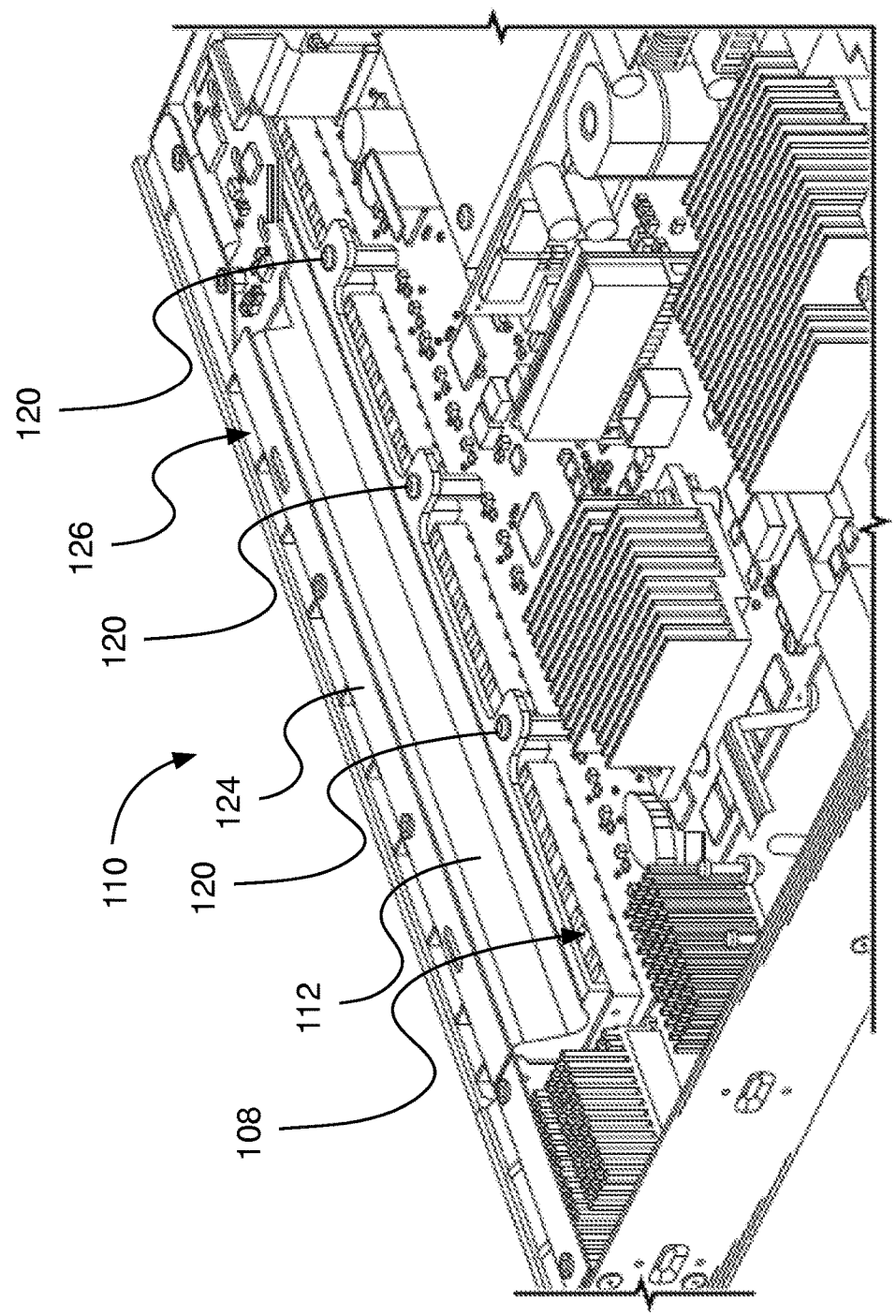
FIG. 3 is a perspective view of an interior of the switch of FIG. 1 including a thermal management system according to some implementations.
Figure 4:
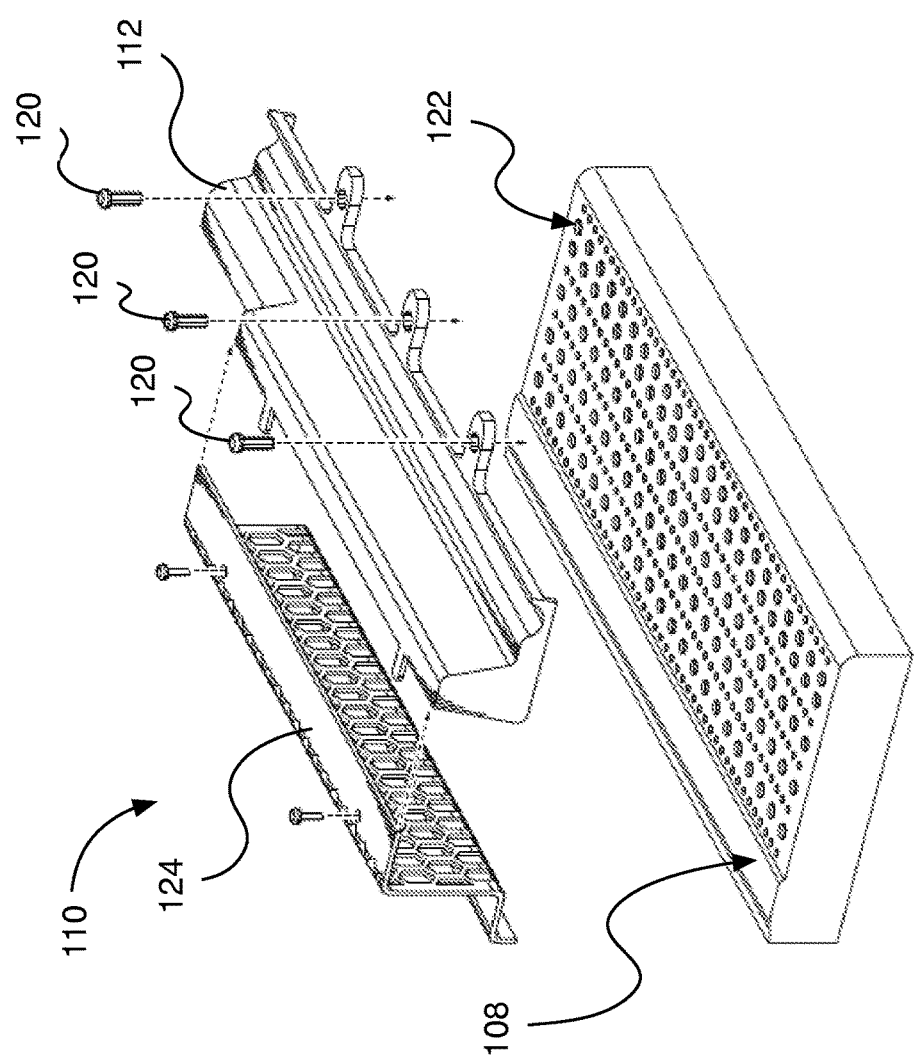
FIG. 4 is an exploded view of the thermal management system of FIG. 3 according to some implementations.

FIG. 3 is a perspective view of a thermal management system assembled within a switch (or another electronic device) according to some implementations. For a better understanding of the example implementation shown in FIG. 3, FIG. 4 depicts an exploded view of the thermal management system 110. The thermal management system 110, as shown, includes the device cage 108 and the air guide 112. The air guide 112 and the device cage 108 together form a converging-diverging body for passing air that produces high velocity airflow across the device cage 108, extracts heat from the exterior surfaces of the device cage 108 and enhances convective heat transfer.

Figure 5:
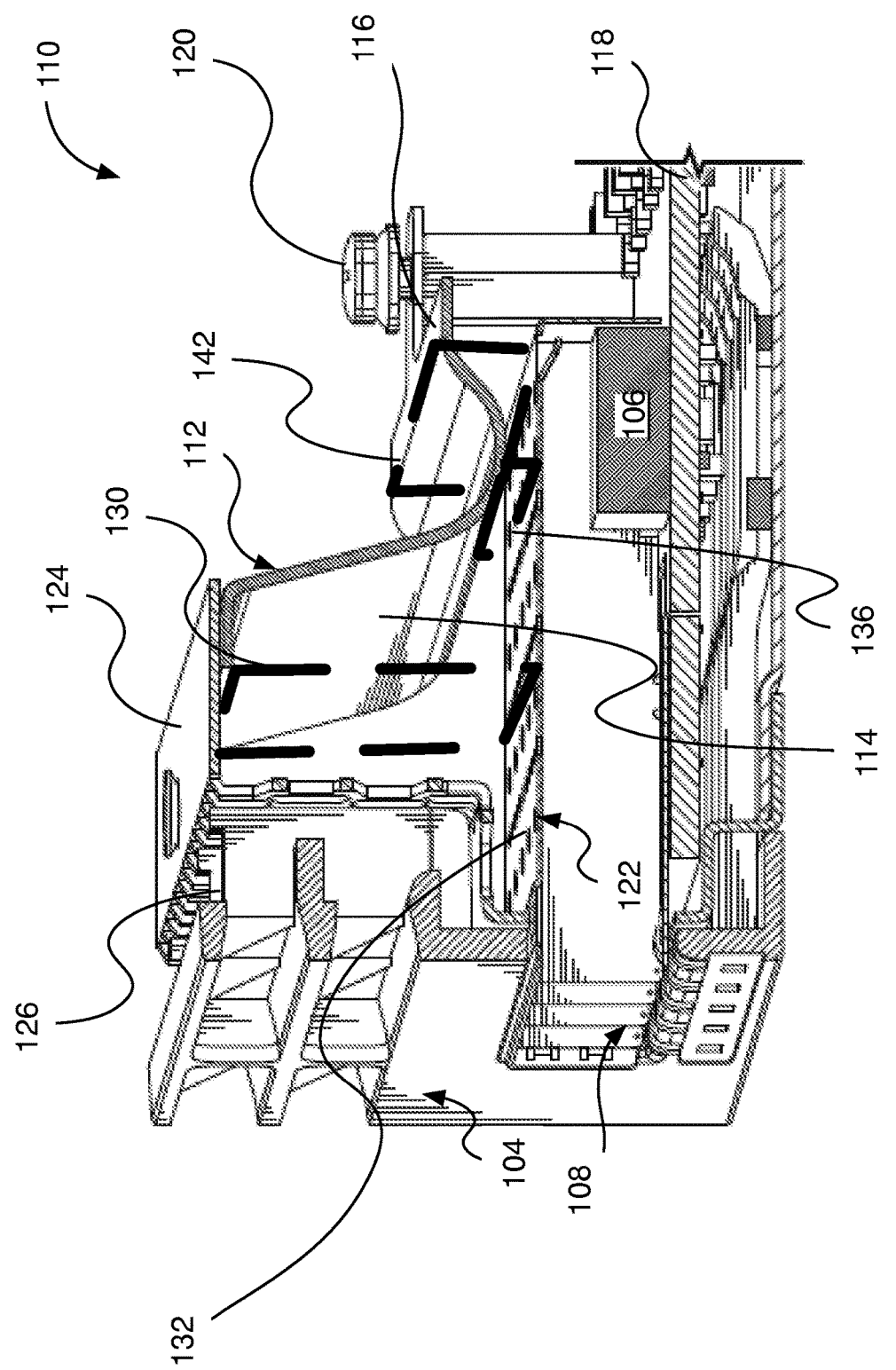
FIG. 5 is a perspective cross-section view of the thermal management system shown in FIGS. 3 and 4 according to some implementations.

FIG. 5 is a perspective cross-section view of the thermal management system 110 shown in FIGS. 3 and 4. As shown in FIG. 5, at least a portion of the air guide 112 is spaced apart from the device cage 108, and another portion of the air guide 112 is coupled to the device cage 108. The air guide 112 has an inner surface 114 and an exterior surface 116, one or both of which are optionally rounded and smoothed to reduce air resistance and pressure losses across the air guide 112. In the example implementation shown, the air guide 112 is coupled to device cage 108 via substrate 118 using bolts 120. According to some implementations, the air guide 112 is directly coupled to the device cage 108. According to some implementations, the substrate 118 comprises a printed circuit board (PCB).

The device cage 108 also has apertures 122. As shown in FIG. 4, according to some implementations, the apertures 122 can include apertures of various sizes. An electromagnetic interference (EMI) screen 124 is coupled to the air guide 112 and the device cages 108. The portside panel 104 is also coupled to the device cages 108 and has air inlet vents 126 (also referred to individually as air inlet vent 126).

Figure 6:
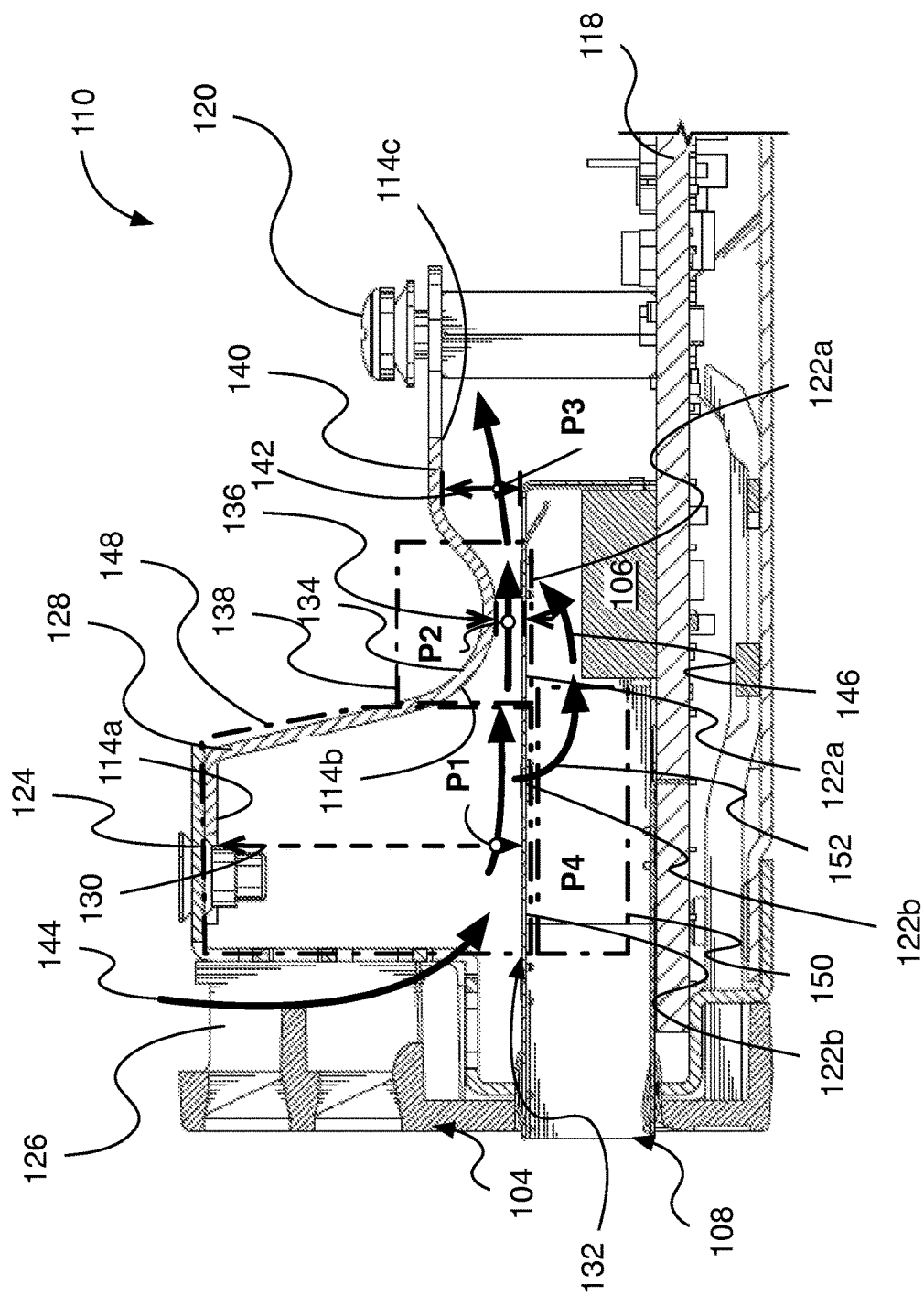
FIG. 6 is a cross-section view of the thermal management system shown in FIGS. 3 to 5 according to some implementations.

FIG. 6 is a cross-section view of the thermal management system 110 shown in FIGS. 3 to 5. As shown in FIGS. 5 and 6, the air guide 112 and the device cage 108 together form an air intake portion 128 having a first airflow area 130 to produce a first air pressure, P1. The first airflow area 130 is defined by a first section 114a of the inner surface 114 and an exterior surface of the device cage 108 having the apertures 122, such as upper surface 132 having apertures 122. An airflow constriction portion 134 follows the air intake portion 128. The airflow constriction portion 134 has a second airflow area 136 smaller than the first airflow area 130 to produce a second air pressure, P2. The second airflow area 136 is defined by a second section 114b of the inner surface 114 of the air guide 112 and the upper surface 132 of the device cage 108. The airflow constriction portion 134 defines a first region 138 of the air guide 112 and the device cage 108. The device cage 108 has at least one aperture, such as apertures 122a, in the first region 138. An outlet portion 140 follows the airflow constriction portion 134 and has a third airflow area 142 to produce a third air pressure, P3. The third airflow area 142 is defined by a third section 114c of the inner surface 114 of the air guide 112 and the upper surface 132 of the device cage 108. In operation, the second air pressure, P2, is less than the first air pressure, P1, and the third air pressure, P3.

According to some implementations, the air guide 112 comprises at least one of metal and plastic. For example, in some implementations, the air guide 112 is fabricated from steel, such a thin gauge steel. As a metallic component, in some implementations, the air guide 112 provides EMI shielding to lower emission of electromagnetic radiation from the device 106.

In some implementations, as shown in FIGS. 1 to 6, the thermal management system 110 includes the EMI screen 124 coupled to the device cage 108, and arranged generally transverse to the air intake portion 128. The thermal management system 110, as depicted, also includes the portside panel 104 coupled to the device cage 108, and arranged generally transverse to the air intake portion 128. However, in some implementations, the described thermal management system does not include one or more of the EMI screen and the portside panel 104. For example, as described above, in some implementations, the air guide 112 includes metal and behaves as an EMI shield. As a result, in some implementations, the EMI screen 124 is omitted.

In operation, the thermal management system 110 induces ventilation inside the device cages 108 such that device surfaces are in contact with moving cooler air, such as the air 144. Due to the pressure differential between the air intake portion 128 and an air pressure zone within the device cage 108, cooler air is pushed into the device cage 108 through at least one of the apertures 122. Due to the low pressure and high velocity of the air at the constriction portion 134, at least some heated air is pulled from the device cage 108 through another one of the apertures 122. As a result, some of the cooler air may also be pulled across a device inside the device cage 108. In more detail, the air 144 from the exterior of the air guide 112 and the device cages 108 flows into the air intake portion 128 through, for example, the air inlet vents 126 on the portside panel 104 and the EMI screen 124. The air 144 is moved into air inlet vents 126 by at least one fan (not shown) situated near to the air guide 112 and the device cages 108 (near enough to move air 144 into the air inlet vents 126). The air 144 flows through the first airflow area 130 at pressure, P1. As the air 144 travels through the airflow constriction portion 134, the velocity of air 144 increases and the pressure of the air 144 decreases to P2. As described above, together the air guide 112 and the device cages 108 behave similarly to a Venturi nozzle, in that with a decrease in airflow area the velocity of the air 144 increases and the pressure of the air 144 decreases. At the smallest cross-sectional area of the airflow constriction portion 134, second airflow area 136, the air 144 reaches a minimum air pressure, P2. As the airflow area increases through outlet portion 140, the velocity of the air 144 flowing through the air guide 112 decreases and the pressure of the air 144 flowing through the outlet portion 140 increases to the third pressure, P3. The first airflow area 130, second airflow area 136 and third airflow area 142 are sized such that the second air pressure, P2, is less than the first air pressure, P1, and the third air pressure P3 and is sufficiently low to draw the heated air 132 from within the device cages 108 through at least one of the apertures 122a in the first region 138. The heated air 146 is often generated by the device 106. In some implementations, the heated air 146 is then expelled through the outlet portion 140. It is understood that the air 144, coming from the exterior of the air guide 112 and the device cages 108, is generally cooler than the heated air 146.

According to some implementations, the air intake portion 128 defines a second region 148 of the air guide 112 and the device cages 108. The device cages 108 have at least one other aperture, such as apertures 122b, in the second region 148. The device cages 108 may have an air pressure zone 150 of a fourth air pressure, P4, that is sufficiently low to draw at least a portion 152 of air 144 from the air intake portion 128 into the device cages 108 through the at least one other aperture, such as apertures 122b. In some implementations, as a result of the movement of the portion 152 of the air 144 into the device cages 108 and the heated air 146 out of the device cage 132, the device 106 is subjected to additional convective cooling.

Figure 7:
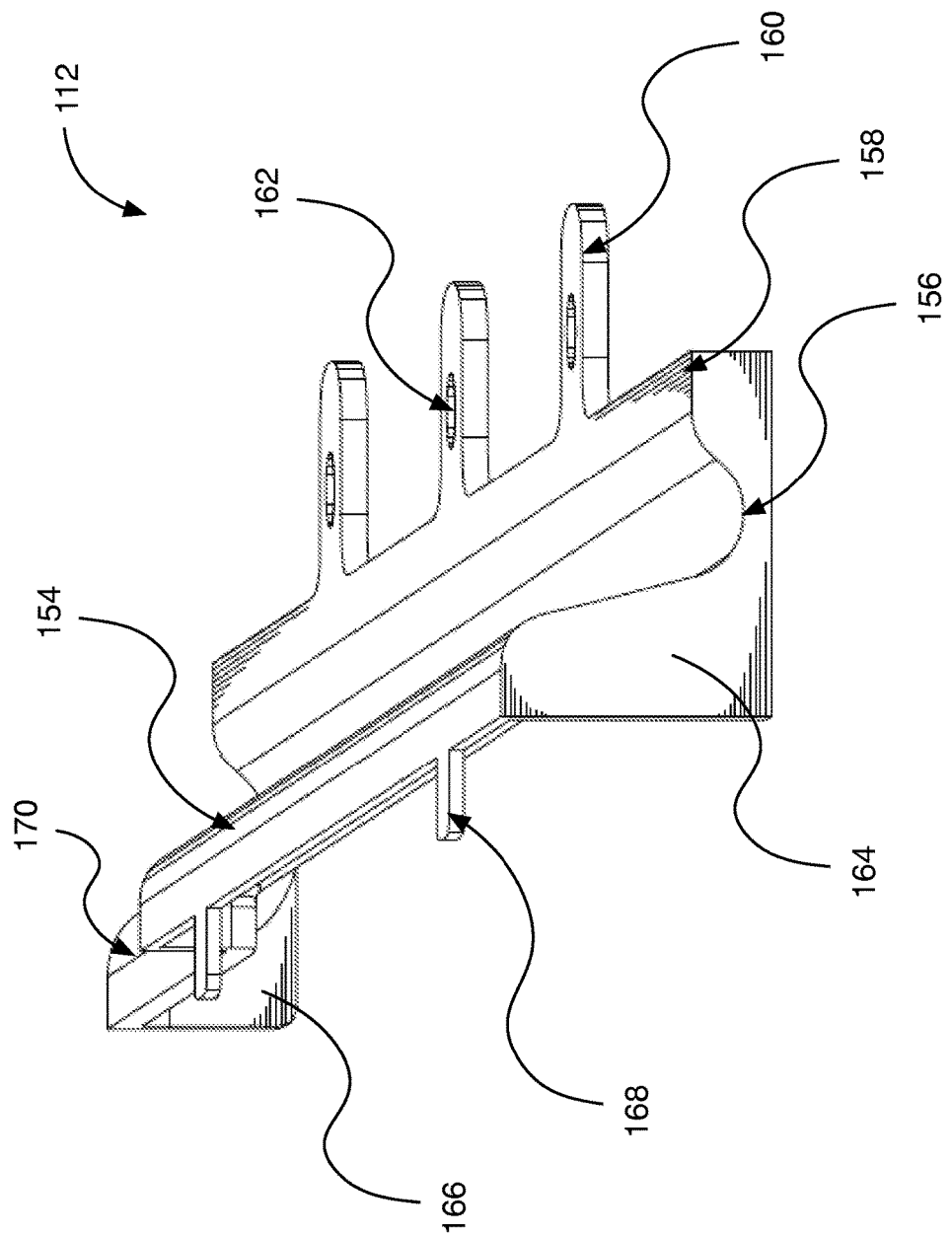
FIG. 7 is an air guide configured for a thermal management system according to some implementations.

FIG. 7 shows the air guide 112 in isolation. The air guide 112 has a first portion 154, a second portion 156 and a third portion 158. The first portion 154, together with the device cages 108, forms the first air intake portion 128. The second portion 156, together with the device cages 108, forms the airflow constriction portion 134. The third portion 158, together with the device cages 108, forms the outlet portion 140. The air guide 112 also includes first tabs 160 having holes 162 for coupling the air guide 112 to the device cages 108 via the substrate 118 using the bolts 116. The air guide 112 further includes a first end cap 164 and a second end cap 166 to help prevent escape of air 144 from the air guide 112, other than through the outlet portion 140. According to some implementations, the air guide 112 includes second tabs 168 to couple the air guide 112 to another component, such as the EMI screen 124 as shown in FIGS. 5 and 6. In some implementations, the air guide 112 includes a shoulder step portion 170 shaped to accommodate placement of neighboring components.

Figure 8:
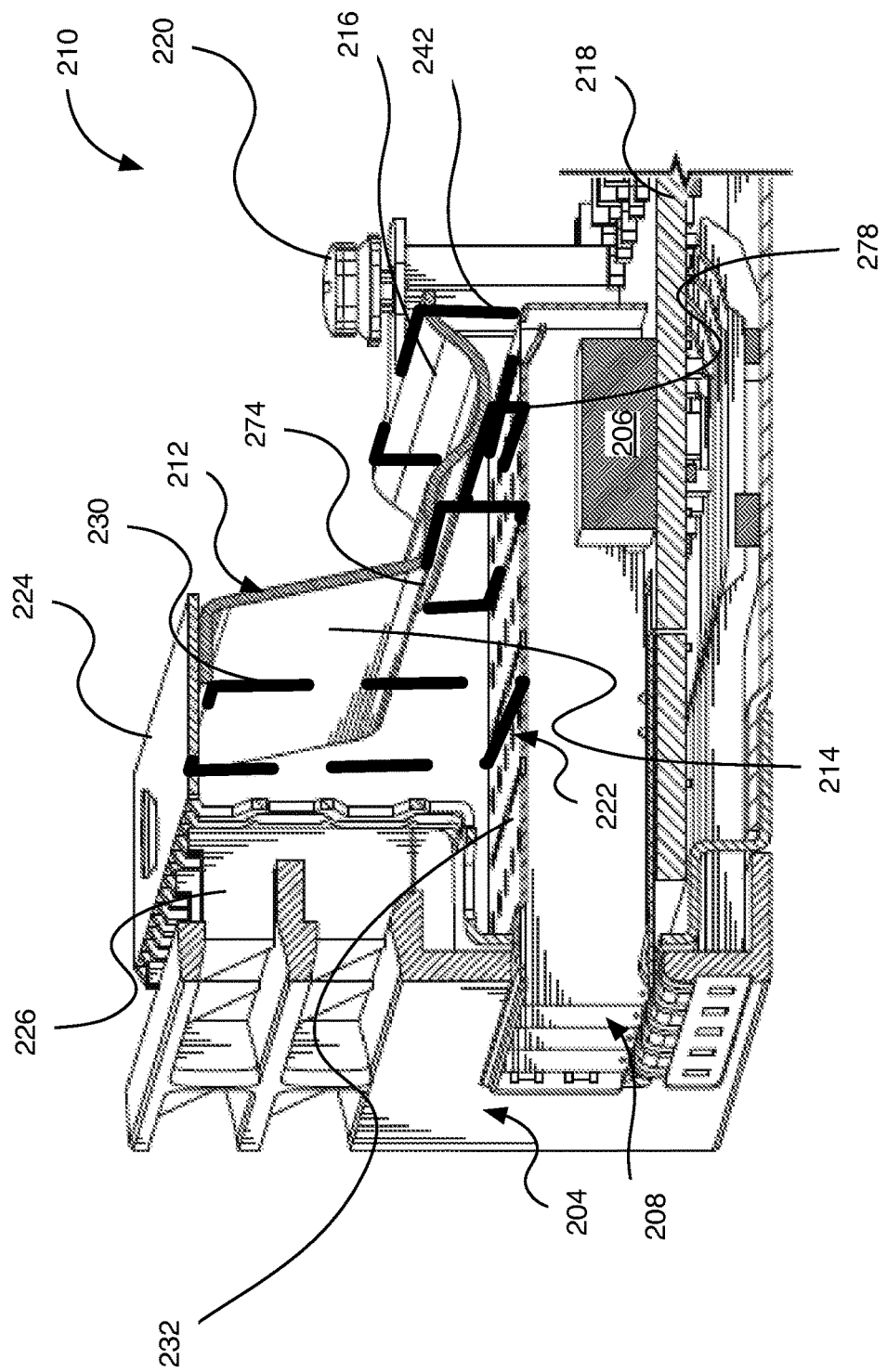
FIG. 8 is a perspective cross-section view of another thermal management system according to some implementations.
Figure 9:
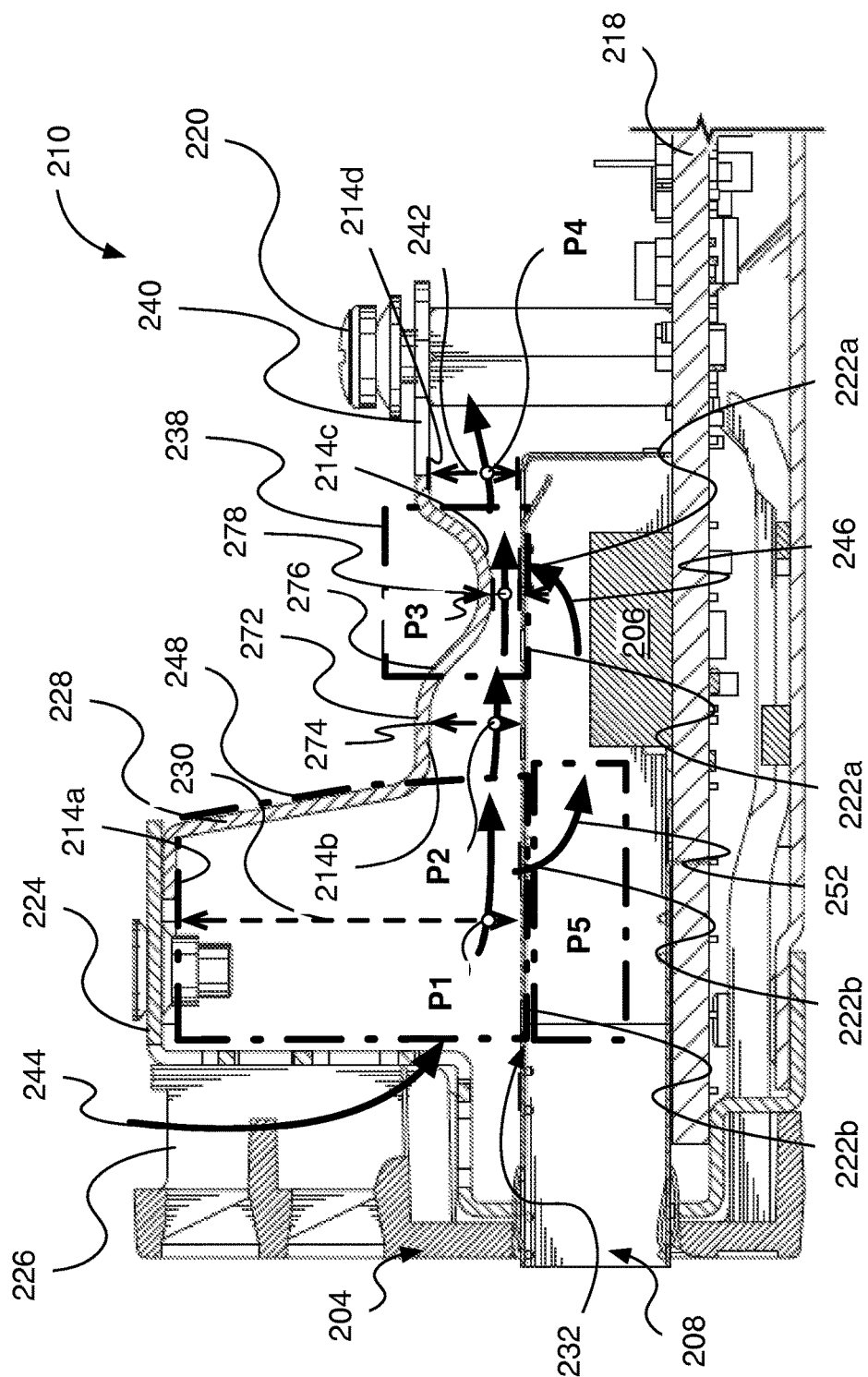
FIG. 9 is a cross-section view of the thermal management system shown in FIG. 8 according to some implementations.
Figure 10:
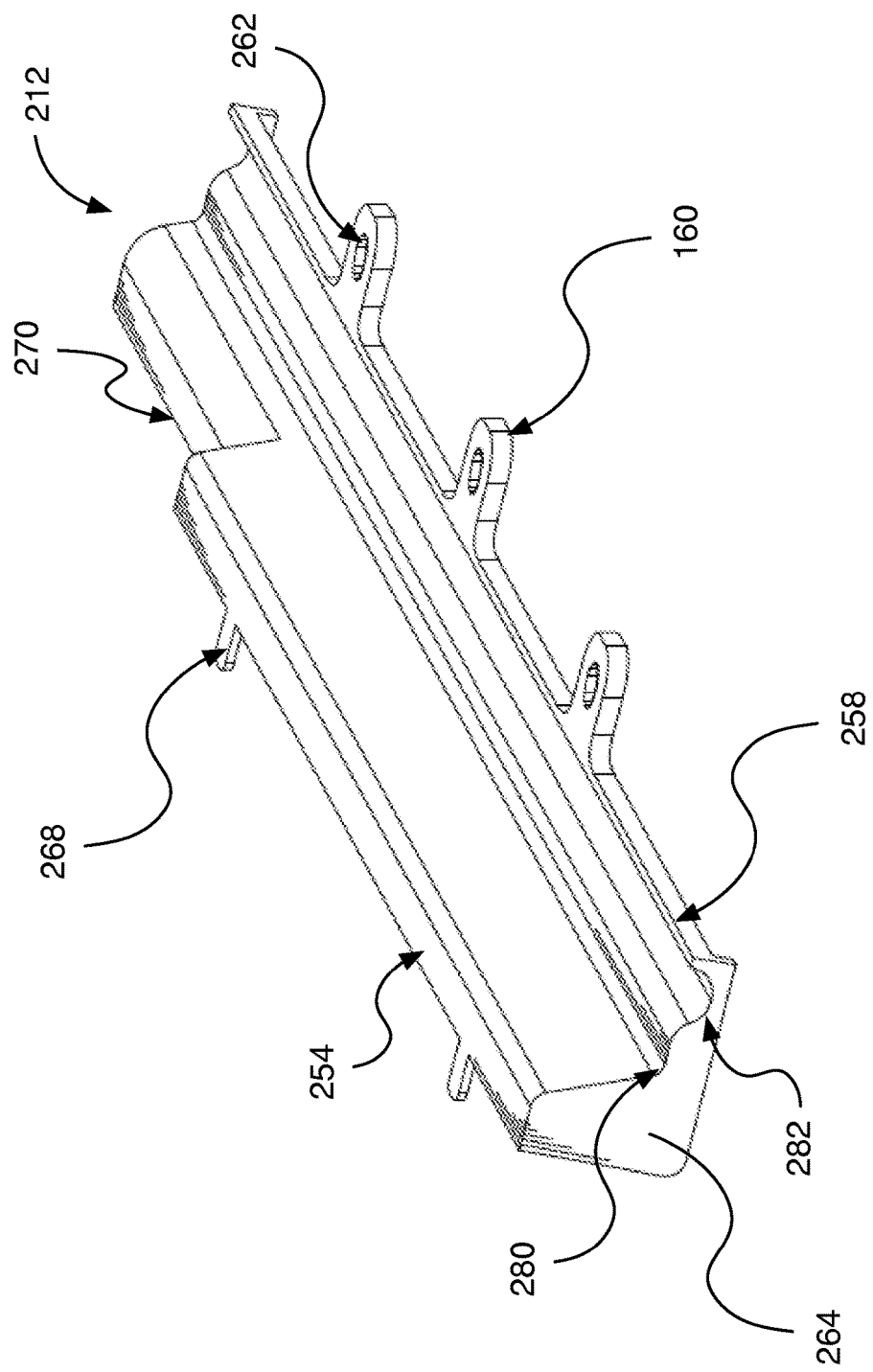
FIG. 10 depicts another air guide of a thermal management system according to some implementations.

FIGS. 8 to 10 show an example thermal management system 210 for devices 206 having more than one airflow constriction portion, first airflow constriction portion 228, and second airflow constriction portion 234. Thermal management system 210 shares at least some components with thermal management system 110, with like or similar elements are numbered with like or similar number to those in thermal management system 110, beginning with a "2" rather than a "1." Again, while pertinent features are illustrated, those skilled in the art will appreciate from the present disclosure that various other features have not been illustrated for the sake of brevity and so as not to obscure more pertinent aspects of the disclosed example implementations.

FIG. 8 is a perspective cross-section view of another thermal management system 210 according to some implementations. Similar to the thermal management system 110, the thermal management system 210, as shown, includes the device cage 208 and the air guide 212. At least a portion of the air guide 212 is spaced apart from the device cage 208 (see FIG. 8) and the air guide 212 is coupled to the device cages 208. The air guide 212 has an inner surface 214 and an exterior surface 216, one or both of which are optionally rounded and smooth to reduce air resistance and pressure losses across the air guide 212. The air guide 212 is coupled to the device cages 208 via the substrate 218 using the bolts 220 (also referred to individually as bolt 220). However, according to some implementations, the air guide 212 is directly coupled to the device cages 208. In some implementations, the substrate 218 includes a printed circuit board (PCB). In some implementations, the device cages 208 have apertures 222.

FIG. 9 is a cross-section view of the thermal management system 210. As shown in FIGS. 8 and 9, the air guide 212 and the device cage 208 together form an air intake portion 228 having a first airflow area 230 to produce a first air pressure, P1. The first airflow area 230 is defined by a first section 214a of the inner surface 214 and an exterior surface of the device cage 208 having the apertures 222, such as the upper surface 232 having the apertures 222. A first air constriction portion 272 follows the air intake portion 228. The first airflow constriction portion 272 has a second airflow area 274 smaller than the first airflow area 230 to produce a second air pressure, P2. The second airflow area 274 is defined by a second section 214b of the inner surface 214 and the upper surface 232. A second airflow constriction portion 276 follows (i.e., is downstream from) the first airflow constriction portion 272. The second airflow constriction portion 276 has a third airflow area 278 smaller than the second airflow area 274 to produce a third air pressure, P3. The third airflow area 278 is defined by a third section 214c of the inner surface 214 and the upper surface 232. The second airflow constriction portion 276 defines a first region 238 of the air guide 212 and the upper surface 232 of the device cages 208. The device cages 208 have at least one aperture, such as apertures 222a, in the first region 238. An outlet portion 240 follows the second airflow constriction portion 276. The outlet portion 240 has a fourth airflow area 242 greater than the third airflow area 278 to produce a fourth air pressure, P4. The fourth airflow area 242 is defined by a fourth section 214d of the inner surface 214 and the upper surface 232 of the device cages 208. In operation, the third air pressure, P3, is less than the first air pressure, P1, the second air pressure, P2, and the fourth air pressure, P4.

In operation, the air 244 from the exterior of the air guide 212 and the device cages 208 flows into the air intake portion 228 through, for example, the air inlet vents 226 of portside panel 204 and the EMI screen 224. In some implementations, the air 244 is moved into the air inlet vents 226 by at least one fan (not shown) situated near to the air guide 212 and the device cages 208 (near enough to move air 244 into air inlet vents 226). The air 244 flows through the first airflow area 230 at pressure, P1. As the air 244 travels through the first airflow constriction portion 272, the velocity of air 244 increases and the pressure of air 244 decreases to P2. Again, as described above, together the air guide 212 and the device cages 208 behave similarly to a Venturi nozzle in that, with a decrease in airflow area, the velocity of air 244 increases and the pressure of air 244 decreases. As the air 244 travels through the second airflow constriction portion 276, the velocity of air 244 increases further and the pressure of air 244 further decreases. At the smallest cross-sectional area of the second airflow constriction portion 276, third airflow area 278, the air 244 reaches a low air pressure, P3. As the airflow area increases through the outlet portion 240, the velocity of air 244 flowing through the air guide 212 decreases and the pressure of air 244 flowing through the outlet portion 240 increases to the fourth pressure, P4.

The first airflow area 230, second airflow area 274, third airflow area 278 and fourth airflow area 242 are sized such that the third air pressure, P3, is less than the first air pressure, P1, the second air pressure, P2, and the fourth air pressure, P4, and is sufficiently low to draw the heated air 232 from within the device cages 108 through at least one of the apertures 222a in the first region 238. The heated air 246 is often generated by the device 206. The heated air 246 is then expelled through the outlet portion 240. It is understood that the air 244, coming from the exterior of the air guide 212 and the device cages 208, is generally cooler than the heated air 246.

According to some implementations, the air intake portion 228 defines a second region 248 of the air guide 212 and the device cages 208. The device cages 208 have at least one other aperture, such as apertures 222b, in the second region 248. In some implementations, the device cages 208 has an air pressure zone 250 of a fifth air pressure, P5, that is sufficiently low to draw at least a portion 252 of the air 244 from the air intake portion 228 into the device cages 208 through the at least one other aperture, such as apertures 222b. In some implementations, as a result of the movement of the portion 252 of air 244 into the device cages 208 and the heated air 246 out of the device cage 232, the device 206 is subjected to additional convective cooling.

FIG. 10 shows the air guide 212 in isolation. The air guide 212 has a first portion, 254, a second portion 280, a third portion 282 and a fourth portion 258. The first portion 254, together with the device cages 208, forms the first air intake portion 228. The second portion 280, together with the device cages 208, forms the first airflow constriction portion 272. The third portion 282, together with the device cages 208, forms the second airflow constriction portion 276. The fourth portion 258, together with the device cages 208, forms the outlet portion 240. The air guide 212 also includes first tabs 260 having holes 262 for coupling the air guide 212 to device cages 208 via substrate 218 using bolts 216. The air guide 212 further includes first end cap 264 and a second end cap (not shown) to help prevent escape of the air 244 from the air guide 212, other than through the outlet portion 240. According to some implementations, the air guide 212 includes second tabs 268 to couple the air guide 212 to another component, such as the EMI screen 224 as shown in FIGS. 8 and 9. In some implementations, the air guide 212 also includes shoulder step portion 270 shaped to accommodate placement of neighboring components.

According to some implementations, the outlet portion 140 is omitted and the interior environment of the external case 102 forms the diverging portion of the Venturi that follows the airflow constriction portion 134. For example, the thermal management system 110 includes the device cage 108 that has a cage surface with at least one aperture, such as the upper surface 132 having the apertures 122, and the air guide 112 that has a guide surface, such as the inner surface 114. The guide surface and the cage surface together form the air intake portion 128 and the airflow constriction portion 134. The air intake portion 128 has an intake airflow area, the first airflow area 130, configured to produce an intake portion air pressure, the first air pressure P1. The airflow constriction portion 134 follows the air intake portion 128 and has a constriction airflow area, the second airflow area 136, that is configured to produce a constriction portion air pressure, the second air pressure P2. The constriction portion air pressure P2 is less than the intake portion air pressure P1 and is sufficient to draw air from the airflow constriction portion 134. In some implementations, the airflow constriction portion 134 defines a first region 138 and the at least one aperture, such as the apertures 122a, is in the first region 134.

As stated above, the interior environment of the external case 102 forms the diverging portion of the Venturi and behaves as the outlet portion 140. Since the airflow area of the internal environment of the external case 102 is greater than the constriction airflow area, the airflow area 136, the air pressure in the external case 102 is greater than P2.

While various aspects of implementations within the scope of the appended claims are described above, it should be apparent that the various features of implementations described above may be embodied in a wide variety of forms and that any specific structure and/or function described above is merely illustrative. Based on the present disclosure one skilled in the art should appreciate that an aspect described herein may be implemented independently of any other aspects and that two or more of these aspects may be combined in various ways. For example, an apparatus may be implemented and/or a method may be practiced using any number of the aspects set forth herein. In addition, such an apparatus may be implemented and/or such a method may be practiced using other structure and/or functionality in addition to or other than one or more of the aspects set forth herein.

It will also be understood that, although the terms "first," "second," etc. may be used herein to describe various elements, these elements should not be limited by these terms. These terms are only used to distinguish one element from another. For example, a first contact could be termed a second contact, and, similarly, a second contact could be termed a first contact, which changing the meaning of the description, so long as all occurrences of the "first contact" are renamed consistently and all occurrences of the second contact are renamed consistently. The first contact and the second contact are both contacts, but they are not the same contact.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

What is claimed is:

1. A thermal management system comprising:
   a device cage having a cage surface including at least one aperture; and
   an air guide, characterized by a guide surface, having at least a portion spaced apart from the device cage, wherein the guide surface and the cage surface together form an air guide passage comprising:
      an air intake portion having a first airflow area characterized by a first volumetric region between a first section of the inner surface of the air guide and the cage surface, wherein a distance between the first section of the inner surface of the air guide and the cage surface within the first airflow area is arranged to produce a first air pressure,
      an airflow constriction portion, following the air intake portion, having a second airflow area characterized by a second volumetric region between a second section of the inner surface of the air guide and the cage surface, wherein a distance between the second section of the inner surface of the air guide and the cage surface within the second airflow area is arranged to produce a second air pressure, wherein a size of the first airflow area is greater than the second airflow area, and wherein the at least one aperture is located within the second airflow area, and
      an outlet portion following the airflow constriction portion having a third airflow area characterized by a third volumetric region between a third section of the inner surface of the air guide and the cage surface, wherein a distance between the third section of the inner surface of the air guide and the cage surface within the third airflow area is arranged to produce a third air pressure, wherein a size of the third airflow area is greater than the second airflow area,
      wherein the second air pressure associated with the second airflow area is less than the first air pressure associated with the first airflow area and the third air pressure associated with the third airflow area, and wherein the distance between the second section of the inner surface of the air guide and the cage surface within the second airflow area is set in order to produce the second air pressure that is sufficient to draw air from within the device cage through the at least one aperture to be expelled through the outlet portion of the air guide passage,
      wherein at least the first, the second, and the third sections of the inner surface are integrally formed together as the guide surface of the air guide.

2. The thermal management system of claim 1, wherein the air intake portion includes at least one other aperture, and the device cage has an air pressure zone of a fourth air pressure sufficient to draw at least a portion of air from the air intake portion into the device cage through the at least one other aperture.

3. The thermal management system of claim 1 further comprising an electromagnetic interference (EMI) screen that is generally transverse to the air intake portion and coupled to the device cage and the air guide.

4. The thermal management system of claim 3 further comprising a front panel having at least one inlet air vent, the front panel coupled to the device cage, and being generally transverse to the intake portion and the EMI screen.

5. The thermal management system of claim 1 further comprising a second airflow constriction portion following the airflow constriction portion, the second airflow constriction portion having a fourth airflow area characterized by a fourth volumetric region between a fourth section of the inner surface of the air guide and the cage surface, wherein a distance between the fourth section of the inner surface of the air guide and the cage surface within the fourth airflow area is arranged, and wherein a size of the second airflow area is greater than the fourth airflow area.

6. A thermal management system comprising:
   a device cage having a planar cage surface including at least one aperture; and
   an air guide, characterized by a guide surface, wherein the guide surface and the planar cage surface together form an air guide passage comprising:
      an air intake portion having an intake airflow area characterized by a first volumetric region between a first section of an inner surface of the air guide and the planar cage surface, wherein a distance between the first section of the inner surface of the air guide and the planar cage surface within the first airflow area is arranged to produce an intake portion air pressure, and
      an airflow constriction portion, following the air intake portion, having a constriction airflow area characterized by a second volumetric region between a second section of the inner surface of the air guide and the planar cage surface, wherein a distance between the second section of the inner surface of the air guide and the planar cage surface within the second airflow area is arranged to produce a constriction portion air pressure, wherein the constriction portion air pressure is less than the intake portion air pressure and is sufficient to draw air from within the device cage through the at least one aperture to be expelled downstream from the airflow constriction portion,
      wherein at least the first and the second sections of the inner surface are integrally formed together as the guide surface of the air guide.

7. The thermal management system of claim 6 further comprising an outlet portion following the airflow constriction portion having an outlet airflow area characterized by a third volumetric region between a third section of the inner surface of the air guide and the planar cage surface, wherein a distance between the third section of the inner surface of the air guide and the planar cage surface within the third airflow area is arranged to produce an outlet air pressure greater than the constriction portion air pressure.

8. The thermal management system of claim 7, wherein a size of the constriction airflow area is smaller than the intake airflow area, and wherein a size of the outlet airflow area is greater than the constriction airflow area.

9. The thermal management system of claim 6, wherein the airflow constriction portion includes the at least one aperture.

10. The thermal management system of claim 6, further comprising a second airflow constriction portion following the airflow constriction portion, the second airflow constriction portion having a second constriction airflow area characterized by a fourth volumetric region between a fourth section of the inner surface of the air guide and the planar cage surface, wherein a distance between the fourth section of the inner surface of the air guide and the planar cage surface within the fourth airflow area is arranged to produce another air pressure, and wherein a size of the second constriction airflow is greater than the constriction airflow area.

11. The thermal management system of claim 6, wherein the air intake portion includes at least one other aperture, and the device cage has an air pressure zone of a fourth air pressure sufficient to draw at least a portion of air from the air intake portion into the device cage through the at least one other aperture.

12. The thermal management system of claim 6 further comprising an electromagnetic interference (EMI) screen that is generally transverse to the air intake portion and coupled to the device cage and the air guide.

13. The thermal management system of claim 12 further comprising a front panel having at least one inlet air vent, the front panel coupled to the device cage, and being generally transverse to the intake portion and the EMI screen.

* * * * *